(12) United States Patent
Hobbs

(10) Patent No.: US 6,399,946 B1
(45) Date of Patent: Jun. 4, 2002

(54) PYROELECTRIC FILM SENSORS

(75) Inventor: Philip Charles Danby Hobbs, Briarcliff Manor, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/547,894

(22) Filed: Apr. 12, 2000

(51) Int. Cl.[7] ............................................. H01L 37/00

(52) U.S. Cl. ................................................... 250/338.2

(58) Field of Search ........................... 250/338.2, 338.3, 250/338.4, 370.14

(56) References Cited

PUBLICATIONS

Fujitsuka, Norio et al, Monolithic Pyroelectric Infrared Image Sensor Using PVDF Thin Film, IEEE, Jun. 16–17, 1997.*

* cited by examiner

Primary Examiner—Georgia Epps
Assistant Examiner—Alicia Harrington
(74) Attorney, Agent, or Firm—Stephen C. Kaufman, Esq.; McGinn & Gibb, PLLC

(57) ABSTRACT

A method for constructing a thin-film infrared photodetector includes providing a thin film including ferroelectric polymer, and applying at least one electrically conductive coating to the polymer so that the coating is nonuniform in surface conductivity to thereby provide an area of higher surface resistance connected to an output region by an area of lower surface resistance.

17 Claims, 6 Drawing Sheets

Two layer metallization: a lattice of thick metal for wiring connects together the possibly-discontinuous absorbing regions, yielding a 20-fold efficiency increase.

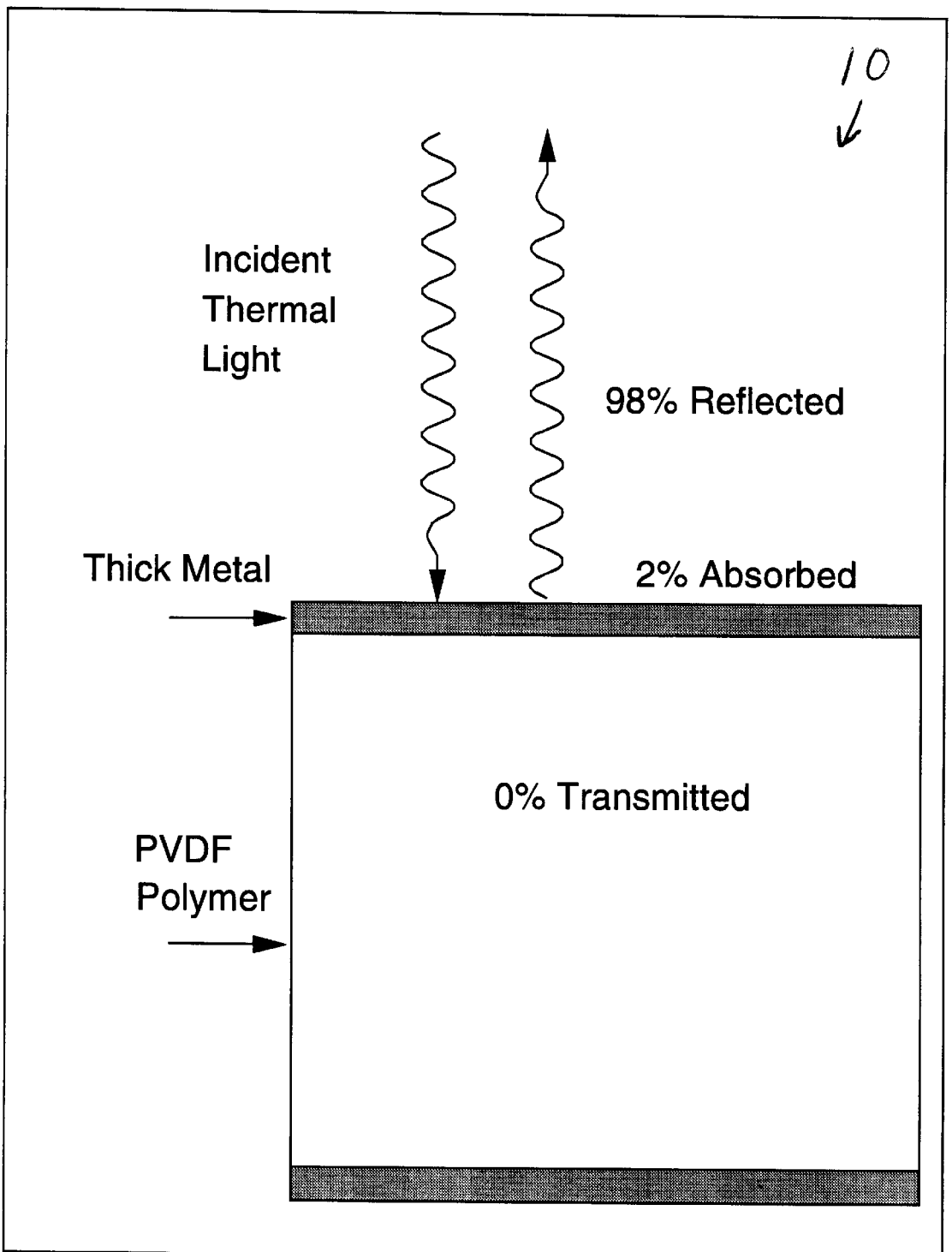
Figure 1: Thick metal films (75-100 nm) are robust enough for use, but have only 2% absorbance, a huge waste of signal.

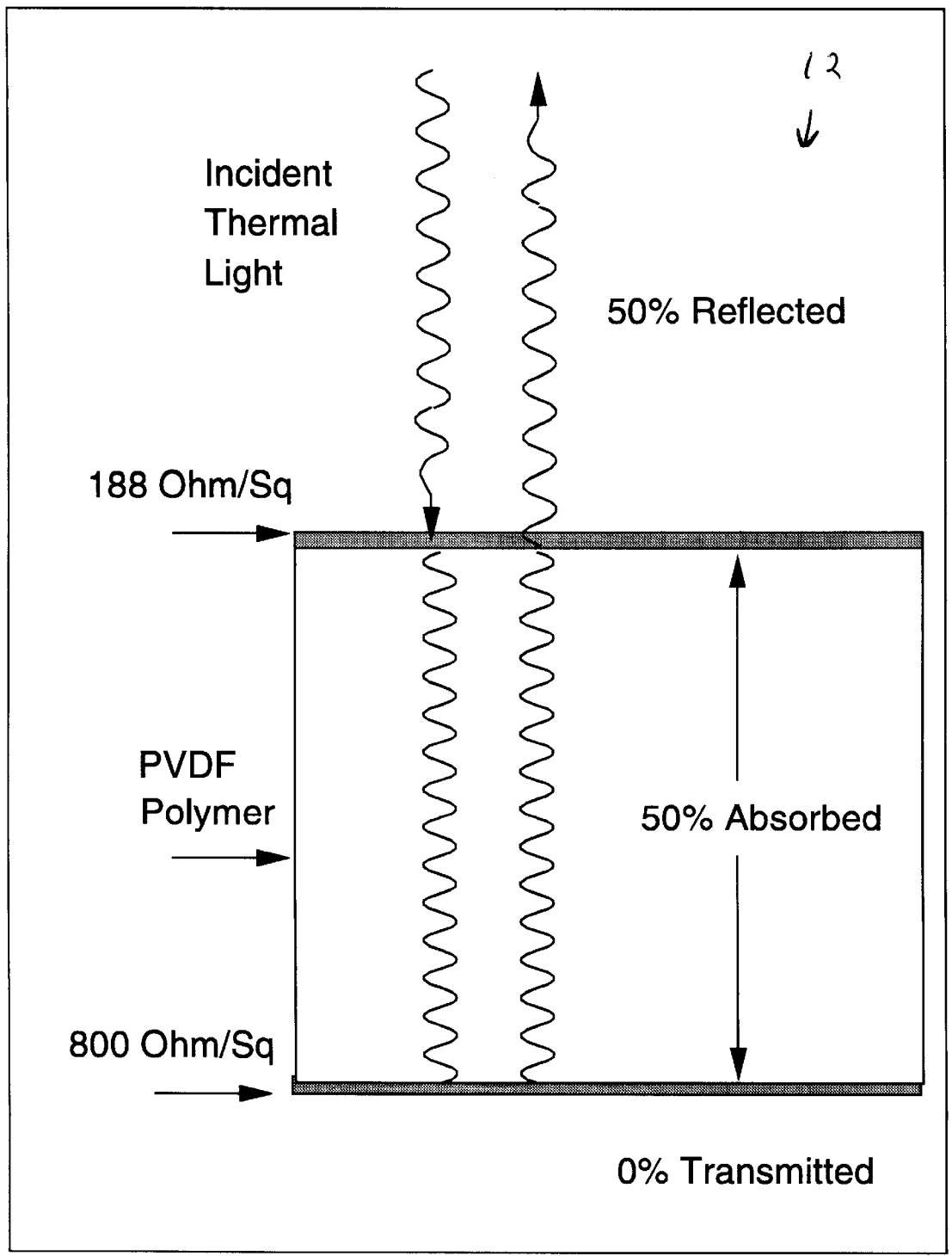
Figure 2: Thinner films are much better absorbers but are fragile and discontinuous, so they are unsuitable for wiring

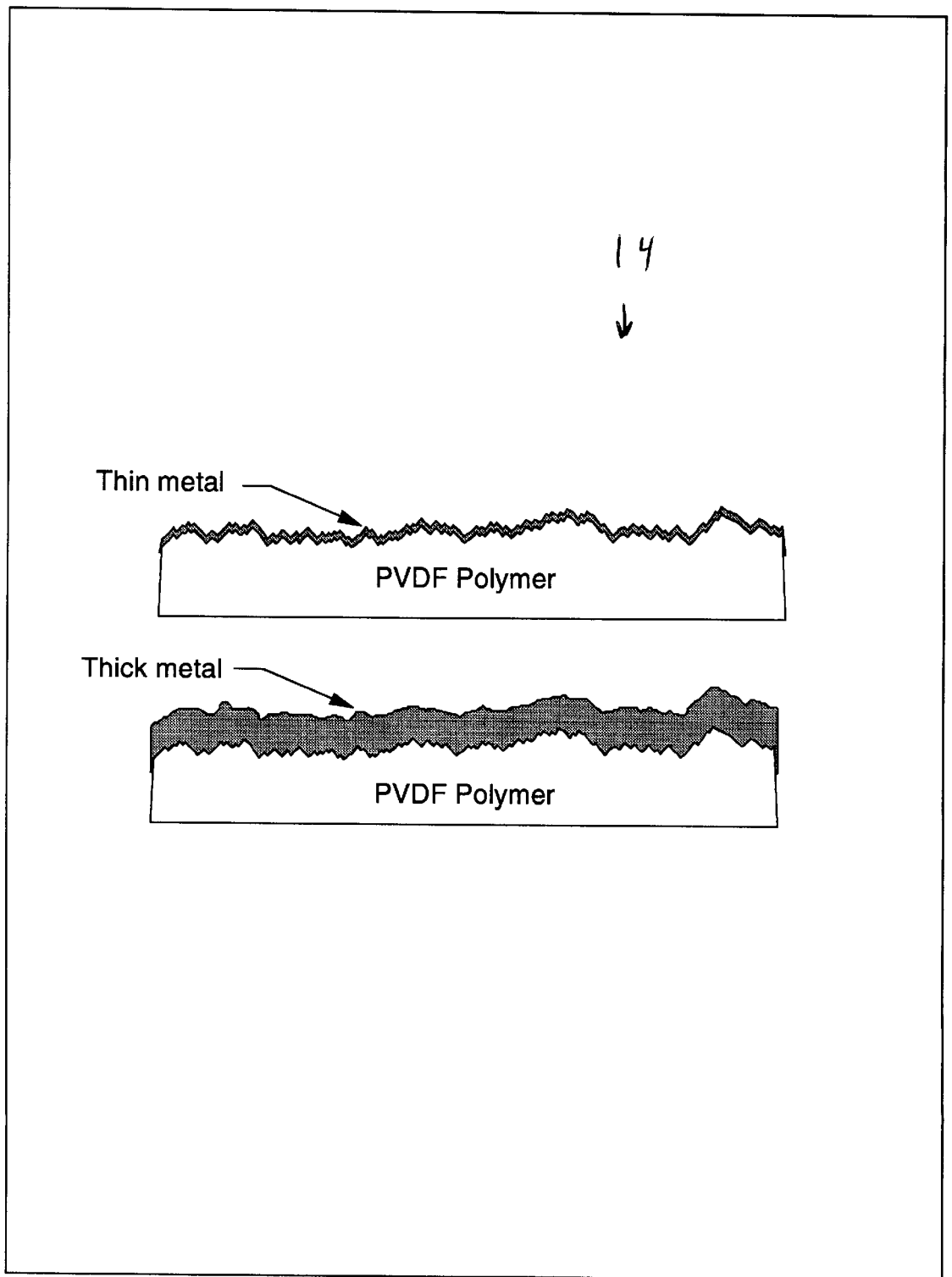
Figure 3: A few-nanometre film on a rough surface

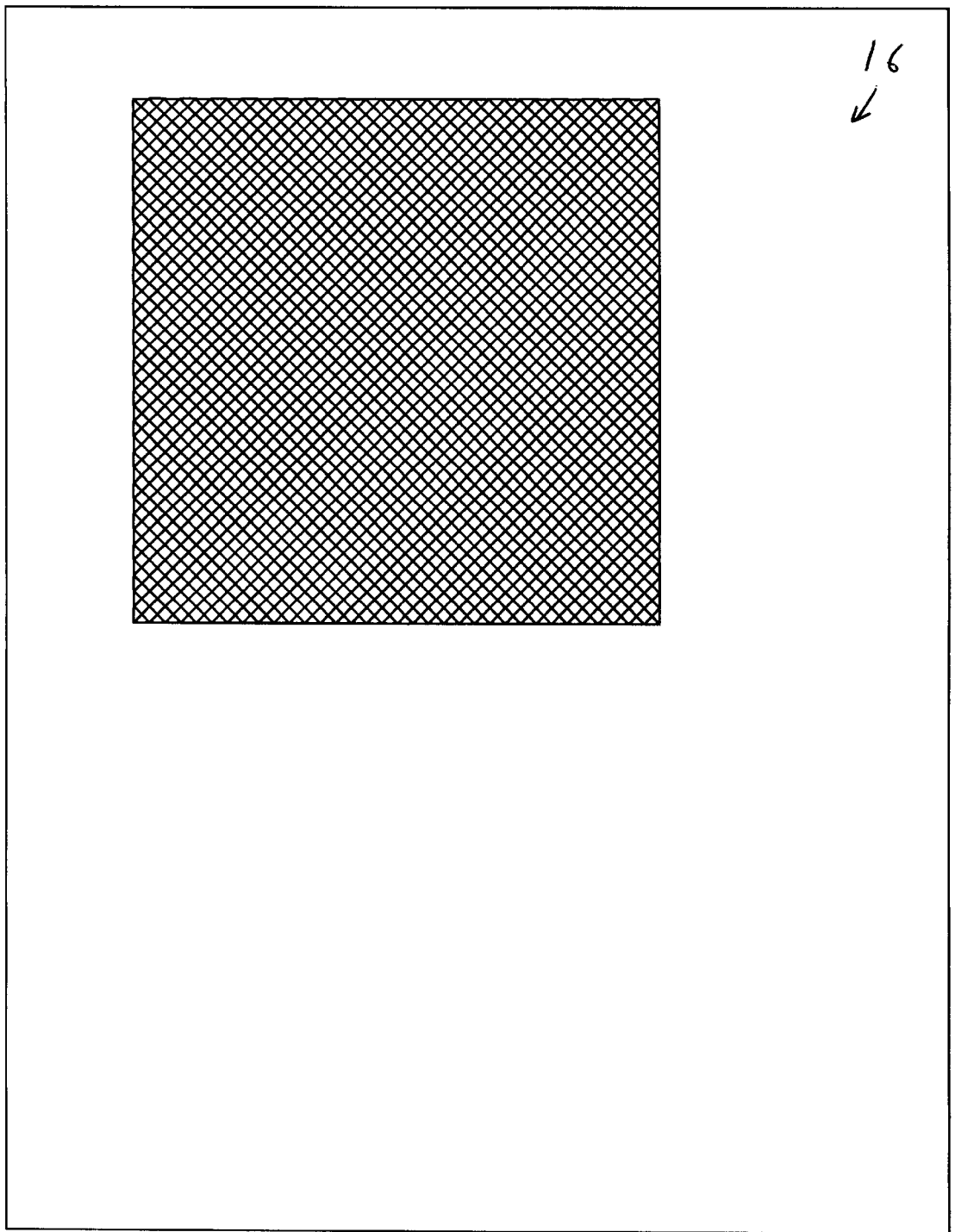
Figure 4: A combination of a uniform thin absorber film with an open latticework of thicker metal combines the advantages of both metal systems. Here a 25% coverage lattice produces overall absorbance of 38%.

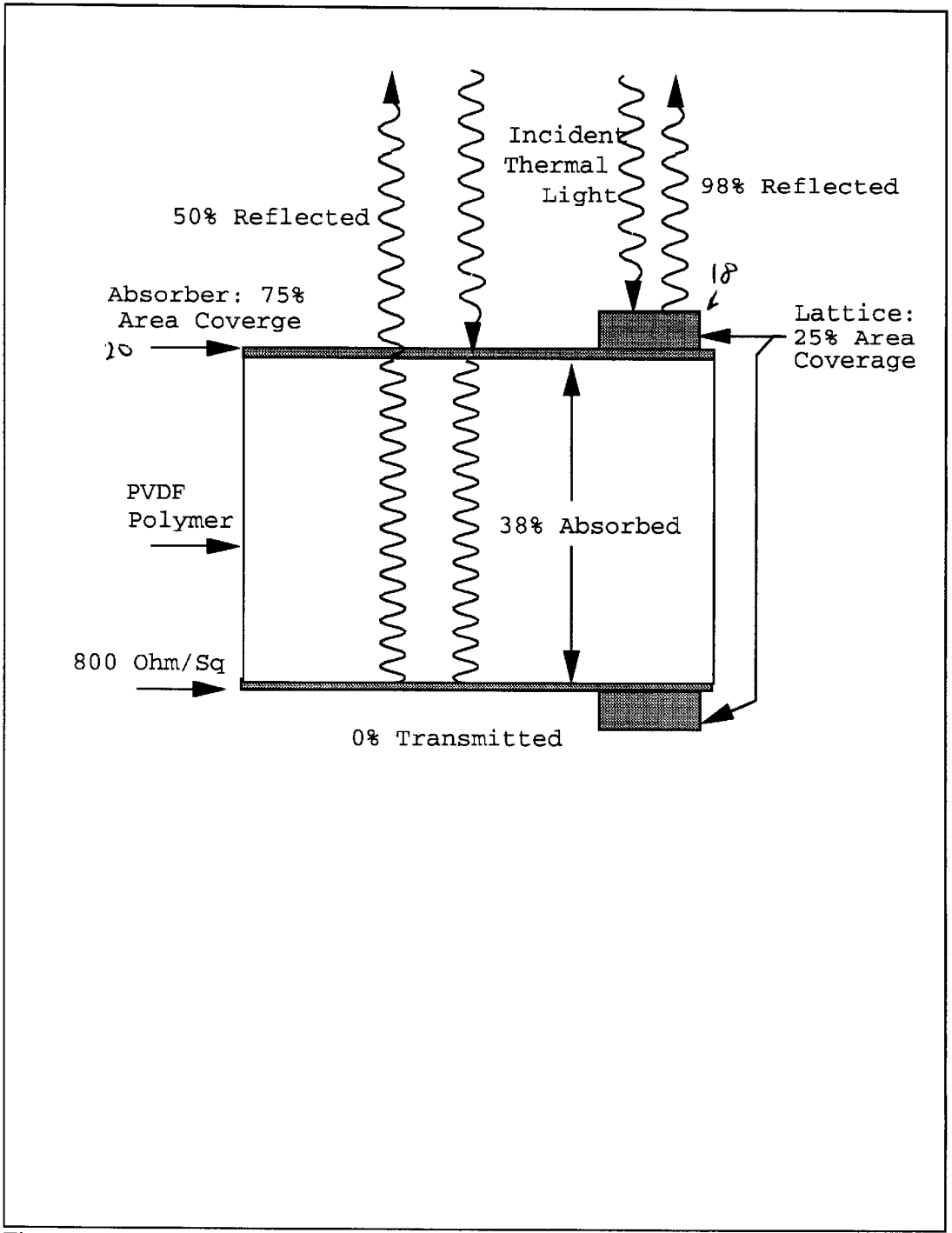
Figure 5: Two layer metallization: a lattice of thick metal for wiring connects together the possibly-discontinuous absorbing regions, yielding a 20-fold efficiency increase.

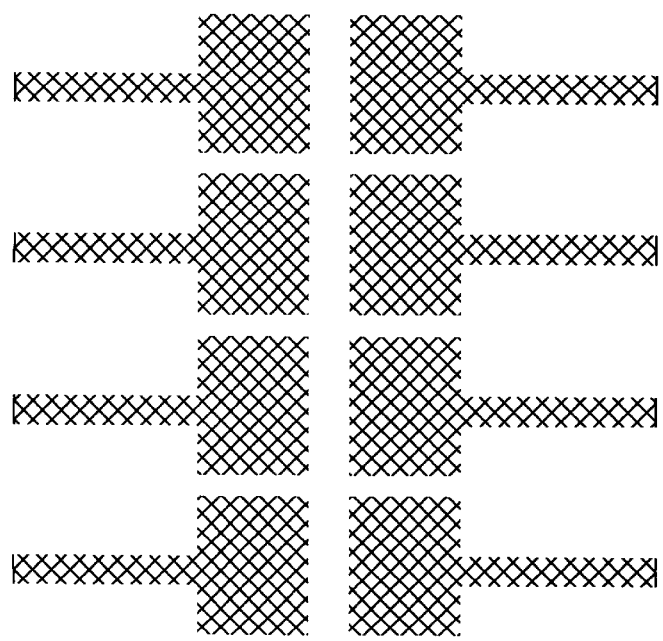
Figure 6: Example of a latticework metal structure, subsequently patterned into sensor and wiring elements.

PYROELECTRIC FILM SENSORS

FIELD OF THE INVENTION

This invention relates to improved pyroelectric film sensors.

BACKGROUND OF THE INVENTION

Thermal sensors for infrared radiation are widely used in applications from motion detection to thermal imaging. Of the many available kinds, far and away the most economical are pyroelectric detectors made from a thin film of poled ferroelectric polymer, poly(vinylidene difluoride) (PVDF).

The more familiar ferromagnetic materials, when magnetized by an applied magnetic field, exhibit a remanent magnetization even when the external field is removed. Similarly, a ferroelectric is a dielectric that, after being poled, exhibits a remanent electric polarization in the absence of any applied voltage. Such a poled ferroelectric is called an electret. The remanent polarization is strongly temperature dependent, dropping to zero at a temperature characteristic of the material, its Curie point, which for PVDF is about 120 C. It is this temperature dependence that makes them useful for temperature measurements.

Just as a ferromagnet's field can be described as arising from bound currents circulating in the ends of its pole pieces, so a ferroelectric's polarization can be described usefully as a bound charge, located in a sheet just inside the polymer layer.

Because this bound charge will produce a nonzero electric field outside the film, it attracts free charge to the surfaces until overall electrical neutrality is achieved. As the film's temperature changes, the amount of surface charge required also changes, and if these charges are made to flow through an external circuit, they form the basis of a temperature measurement scheme of great sensitivity, enough to be a competitive thermal radiation detector for objects near room temperature.

Our work includes a summary critique of important prior art that refers to pyroelectric film sensors, as well as review of a sensor's underlying physics, to an end of developing new insights and methodology that can be of value in disclosing a new and improved pyroelectric film sensor.

One major drawback of film sensors as optical sensors is the difficulty of coupling them to the radiation field; they reflect most of the incident infrared radiation from their metallized surfaces. The figure of merit for an emitter or absorber of thermal radiation is its emissivity, which is the ratio of the total power radiated or absorbed per unit area to that of a perfect black body in similar conditions. The emissivity is always between 0 and 1, and is always equal to the absorptivity, which is the corresponding figure of merit for absorption.

In order to capture the displaced charge, the surfaces of the film must be coated with an electrical conductor; though the currents are typically very small, so that no great thickness is required, still the film must be thick enough to survive handling and to maintain electrical continuity between all areas of the sensor element and the external wiring.

Although 25 nm films of certain metals such as Inconel, nickel, and rhodium make respectable absorbers in the visible, in the mid and far IR such films look like perfect conductors, keeping the infrared emissivity down near 0.02 and the measurement's sensitivity and signal to noise ratio (SNR) accordingly 34 dB below their theoretical maxima, as shown in FIG. 1 (numeral 10). In the visible, it is not difficult to make a surface a better absorber: just paint it black. A black surface is one which attenuates light gradually over a depth of many wavelengths; a lossier material (i.e., a better conductor), whose absorption depth is less than a wavelength starts to look like a metal instead. In the infrared, metals become essentially perfect conductors, so the absorption depth becomes small just as the wavelength increases, making it dramatically more difficult to build efficient absorbers that are not extremely thick.

Because usually one wants to build pyroelectric sensors that are as fast as possible, thick coatings that would slow down thermal diffusion and add a huge thermal mass are inadmissible, which is a problem. It really isn't a matter of the surface properties of the film, because in order for any surface to be really black, it has to be many wavelengths deep. At 10 microns, that means a big thick structure that will have an enormous thermal mass, which will dominate the response time of the sensor.

In the prior art, there is a significant amount of discussion of thin-film solutions to this problem, using thin metal films on the top and bottom surface of a free-standing polymer film.

One especially relevant paper is S. Bauer, S. Bauer-Gogonea, W. Becker, R. Fettig, B. Ploss, W. Ruppel, and W. von Munch, "Thin metal films as absorbers for infrared sensors", Sensors and Actuators A, v37–38, pp. 497–501 (1993).

The authors' main point is that optically thin metal films (less than one absorption length) look like the optical equivalent of a lumped-constant RLC network in RF circuits, and that a pyroelectric film sensor can be given extremely good broadband absorption properties (e.g. absorptivity >0.5 and completely flat from 3–200 microns), all by adjusting the film thickness on the front and back. The two metal layers, 188 ohms/square on the top of the film (where the radiation hits) and 800 ohms/square on the bottom, reach the optimal absorption with almost no impact on the thermal mass whatever (e.g., see FIG. 2, numeral 12).

These films are extremely thin, just a few nanometers, and correspondingly fragile. Since as mentioned above, the surface films must function as wiring as well as absorber, this is a serious drawback. It is very difficult to make a nanometer-thickness coating be continuous across a centimeter-size piece of pyroelectric film, and even more difficult to keep it continuous under handling (e.g., see FIG. 2). Thus there is apparently a dilemma: one can improve the sensitivity of these sensors by 25 times (28 dB) by thinning down the metal coatings, but one can't connect to them.

One method for solving this problem is to use two lithography steps on each side of the film. A film with the thin absorber layers can be patterned into pixels in one mask step, and then wiring can be deposited in a second step, either by screen-printing conductive ink or by evaporation, sputtering, or plating through a photoresist layer that is subsequently removed, much as is done in semiconductor processing. The problem is that multistep lithography on free-standing films is difficult and expensive, whereas the simple single-layer films can be patterned almost trivially using printed-circuit technology.

SUMMARY OF THE INVENTION

The present invention, in sharp contrast to the above discussion referencing prior art techniques and physics, as it pertains to pyroelectric film sensors, proceeds in a qualitatively different methodological manner. In particular, an object of the present invention is to exploit the high conductivity of the thick metal and the high absorptivity of the thin metal system in combination, to reap most of the sensitivity improvement while keeping the reliability and simplicity of the single thick metal layer approach.

Accordingly, in a first aspect of the present invention, a method for constructing a thin-film infrared photodetector includes providing a thin film of ferroelectric polymer, and applying at least one electrically conductive coating to the polymer so that the coating is nonuniform in surface conductivity for providing an area of higher surface resistance connected to an output region by an area of lower surface resistance. The method may advantageously further include patterning the film so as to change the electrical connectivity of an area.

In the invention, in a second aspect, a method for improving the performance and manufacturability of thin-film infrared photodetectors includes depositing a very thin layer of an absorbing material including a metal on a surface of detector material, and depositing a pattern of a thicker layer including electrically conductive material which is electrically continuous over at least a portion of the thin layer but contains spaces which allow incident radiation to reach the thin layer.

In a third aspect of the present invention, a photodetector includes a thin-film including ferroelectric polymer, the thin-film including at least one electrically conductive coating characterized in that the coating is nonuniform in surface conductivity, for thereby providing an area of higher surface resistance connected to an output region by an area of lower surface resistance.

BRIEF DESCRIPTION OF THE DRAWING

The invention is illustrated in the accompanying drawings in which:

FIGS. 1 and 2 provide heuristics for understanding the theoretical background of the invention;

FIGS. 3 and 4 provide heuristics for understanding aspects of the present invention; and FIGS. 5 and 6 provide schematics for realization of advantageous embodiments of the present invention.

DETAILED DESCRIPTION OF THE INVENTION

Turning now to FIGS. 3–6, preferred embodiments of the invention will be described. For example, in a first preferred embodiment a film is uniformly coated with thin absorbers, and then with an electrically continuous open latticework of thicker metal. The latticework itself is a poor absorber, but forms only a small proportion of the total surface area; the thin film is fragile and probably discontinuous (e.g., see FIG. 3, numeral 14), but is shorted together by the latticework. Thus, the combination achieves nearly the absorptivity of the thinner film system (e.g., see FIG. 4, numeral 16) with nearly the robustness of the thicker film system.

In a non-limiting embodiment, a method for constructing the thin-film infrared photodetector, includes providing a thin film of ferroelectric polymer, and applying at least one electrically conductive coating to the polymer so that the coating is nonuniform in surface conductivity for providing an area of higher surface resistance connected to an output region by an area of lower surface resistance. Additionally, the method may include advantageously patterning the film so as to change the electrical connectivity of an area.

Preferably, a portion of the area of lower surface resistance forms a lattice.

The electrically conductive coating may be selected from the group consisting of nickel, copper, chromium, and gold.

Preferably, the area of higher surface resistance has a surface resistance between 50 and 1500 ohms per square.

Preferably, the area of lower surface resistance has a surface resistance between 0.01 and 100 ohms per square.

In a further non-limiting embodiment, a method for improving the performance and manufacturability of thin-film infrared photodetectors includes depositing a very thin layer of an absorbing material including a metal on a surface of detector material, and depositing a pattern of a thicker layer including electrically conductive material which is electrically continuous over at least a portion of the thin layer but contains spaces which allow incident radiation to reach the thin layer, these steps being made in either order in time.

The method preferably includes patterning the surface layers afterwards. For example, layers may be patterned in a single mask step, preferably using printed circuit fabrication methods.

The detector material preferably includes a pyroelectric, for example, a thin-film polyvinylidene difluoride (PVDF).

The thicker layer preferably includes a conductive ink, for example, a conductive polymer or a silver ink.

The conductive ink may be applied inter alia by inkjet printing or screen printing.

The thicker layer may be applied by plating or by vacuum coating.

In another non-limiting embodiment, a photodetector includes a thin-film including ferroelectric polymer. The thin-film includes at least one electrically conductive coating characterized in that the coating is nonuniform in surface conductivity. Thus, an area of higher resistance connected to an output region by an area of lower surface resistance is thereby provided.

In a preferred embodiment, of a type shown in FIG. 5, a thick metal film (18) preferably is deposited over a thin metal (20), preferably by mechanical lithography; resist preferably is screen-printed over the thin metal (20), then the thick metal (18) is deposited preferably uniformly and the resist stripped chemically. The thick layer forms a uniform lattice pattern (e.g., see FIG. 6, numeral 22).

The dimensions of the lattice preferably are chosen so as to expose most of the thin metal coating to the incident infrared light, so preserving most of the efficiency increase, while remaining dense enough to remain robust and fine enough so that the smallest desired pattern dimensions preferably include at least one continuous path in the thicker metal. The resulting coated film has the mechanical properties of the thicker film while remaining approximately 20 times more sensitive to infrared light. This approach is superior to processes requiring the user of the film to perform two-level lithography on the film, because it can be done on a large scale in the film production process and the user can still pattern it with the printed-circuit technology in a single mask step (e.g., see FIG. 6).

I claim:

1. A method for constructing a thin-film infrared photodetector, the method:

providing a thin film comprising ferroelectric polymer; and applying at least one electrically conductive coating to the polymer so that the coating is nonuniform in surface conductivity for thereby providing an area of higher surface resistance connected to an output region by an area of lower surface resistance.

2. A method according to claim 1, wherein a portion of the area of lower surface resistance comprises a lattice.

3. A method according to claim 1, further comprising:
selecting the electrically conductive coating from the group consisting of nickel, copper, chromium, and gold.

4. A method according to claim 1, wherein the area of higher surface resistance has a surface resistance between 50 and 1500 ohms per square.

5. A method according to claim 1, wherein the area of lower surface resistance has a surface resistance between 0.01 and 100 ohms per square.

6. A method according to claim 1, further comprising:
patterning the film for changing the electrical conductivity of an area.

7. A method for improving the performance and manufacturability of thin-film infrared photodetectors, the method comprising:
depositing a very thin layer of an absorbing material comprising a metal on a surface of detector material; and
depositing a pattern of a thicker layer comprising electrically conductive material which is electrically continuous over at least a portion of the thin layer but contains spaces which allow incident radiation to reach the thin layer, these depositions being made in either order in time.

8. A method according to claim 7, further comprising:
patterning the surface layers afterwards.

9. A method according to claim 8, comprising:
patterning the layers in a single mask operation using printed-circuit fabrication methods.

10. A method according to claim 9, wherein the detector material comprises a pyroelectric.

11. A method according to claim 10, wherein the pyroelectric comprises a thin-film of polyvinylidene difluoride (PVDF).

12. A method according to claim 7, wherein the thicker layer comprises a conductive ink.

13. A method according to claim 12, further comprising:
applying the conductive ink by inkjet printing.

14. A method according to claim 12, further comprising:
applying the conductive ink by screen printing.

15. A method according to claim 7, further comprising:
applying the thicker layer by plating.

16. A method according to claim 7, further comprising:
applying the thicker layer by vacuum coating.

17. A photodetector comprising:
a thin-film comprising ferroelectric polymer, the thin-film comprising at least one electrically conductive coating that is nonuniform in surface conductivity, for thereby providing an area of higher surface resistance connected to an output region by an area of lower surface resistance.

* * * * *